United States Patent [19]

Bindra et al.

[11] Patent Number: 5,435,057
[45] Date of Patent: Jul. 25, 1995

[54] INTERCONNECTION METHOD AND STRUCTURE FOR ORGANIC CIRCUIT BOARDS

[75] Inventors: Perminder S. Bindra, South Salem; Ross D. Havens, Endicott; Voya R. Markovich, Endwell; Jaynal A. Molla, Endicott, all of N.Y.

[73] Assignee: International Business Machines Corporation, Armonk, N.Y.

[21] Appl. No.: 195,174

[22] Filed: Feb. 14, 1994

Related U.S. Application Data

[60] Division of Ser. No. 913,086, Jul. 14, 1992, Pat. No. 5,298,685, which is a continuation-in-part of Ser. No. 605,615, Oct. 30, 1990, Pat. No. 5,129,142.

[51] Int. Cl.⁶ .............................................. H05K 3/36
[52] U.S. Cl. ...................................... 29/830; 29/846; 174/255
[58] Field of Search ................... 29/830, 831, 846; 174/250, 255, 256, 257, 258, 262, 263, 264, 265, 266; 156/902

[56] References Cited

U.S. PATENT DOCUMENTS

| | | |
|---|---|---|
| 1,155,427 | 10/1915 | Liebmann et al. . |
| 2,461,980 | 2/1949 | Hansen . |
| 2,576,528 | 11/1951 | Matthysse . |
| 3,157,735 | 11/1964 | Strcup et al. . |
| 3,239,597 | 3/1966 | Flynn . |
| 3,254,189 | 5/1966 | Evanicsko, Jr., et al. . |
| 3,526,867 | 7/1967 | Keeler . |
| 3,725,844 | 4/1973 | McKeown et al. . |
| 3,756,891 | 9/1973 | Ryan ................................. 29/825 X |
| 3,795,047 | 3/1974 | Adolafa et al. . |
| 3,818,415 | 6/1974 | Evans et al. . |
| 3,839,727 | 10/1974 | Herdzik et al. . |
| 3,934,334 | 1/1976 | Hanni . |
| 3,984,244 | 10/1976 | Collier et al. . |
| 4,005,698 | 2/1977 | Cuomo et al. . |
| 4,383,003 | 5/1983 | Lifshin et al. . |
| 4,478,883 | 10/1984 | Bupp et al. . |
| 4,551,210 | 11/1985 | Parthasarathi . |
| 4,670,770 | 6/1987 | Tai . |
| 4,774,122 | 9/1988 | Adler . |
| 4,803,450 | 2/1989 | Burgess et al. . |
| 4,830,264 | 5/1989 | Bitaillou et al. . |
| 5,019,944 | 5/1991 | Ishii et al. . |
| 5,105,537 | 4/1992 | Datta et al. . |

FOREIGN PATENT DOCUMENTS

| | | |
|---|---|---|
| 1121011 | 3/1982 | Canada . |
| 2151683 | 4/1973 | Germany . |
| 1-198092 | 8/1989 | Japan . |

OTHER PUBLICATIONS

Whiskers, Sc. Am., 1960.
Metal Whiskers by S. M. Arnold, Bell Telephone Laboratories, Inc., Electrical Manufacturing Nov. 1954 pp. 110–114.
Direct Attachment of a Silicon Carrier for IC Chips to a Circuit Card, vol. 32, No. 4A, Sep., 1989.
Switches by Michael A. Grundfest, Electronic Design, Sep. 13, 1965, pp. 34–38.
Dendrite Connector System with Reinforced Base, IBM Technical Disclosure Bulletin, vol. 23, No. 8, Jan. 1981.
Process for Producing Palladium Structures, IBM Technical Disclosure Bulletin, vol. 14, No. 1A, Jun. 1981.
Liquid Metal/Dendrite Connector, IBM Technical Disclosure Dec. 1979.
Low to High-temperature Capillary, IBM Technical Disclosure Bulletin, vol. 18, No. 4, Sep. 1975.
Assembling High-Density Printed-Circuit Boards, IBM Technical Disclosure Bulletin, vol. 15, No. 1, Jun. 1972.
Dendritic Wick for Heat Pipe Application, IBM Technical Disclosure Bulletin, vol. 14, No. 9, Feb. 1972.

*Primary Examiner*—Carl J. Arbes

[57] ABSTRACT

Polymeric subcomposites of a circuit board are interconnected by metallic dendrites on electrical contact pads whereby electrical contact pads of one or the subcomposites are larger widthwise than electrical contact pads of the other subcomposite.

9 Claims, 3 Drawing Sheets

INTERCONNECTION METHOD AND STRUCTURE FOR ORGANIC CIRCUIT BOARDS

CROSS REFERENCE TO RELATED APPLICATIONS

This is a divisional application of Ser. No. 07/913,086, and now U.S. Pat. No. 5,298,685, filed on Jul. 14, 1992, which is a continuation-in-part of U.S. patent application Ser. No. 07/605,615, and now U.S. Pat. No. 4,129,142, filed Oct. 30, 1990 and entitled "Encapsulated Circuitized Power Core Alignment and Lamination," the entire disclosure of which is incorporated herein by reference.

TECHNICAL FIELD

The present invention is concerned with organic circuit boards and to a method for connecting two or more organic polymeric subcomposites for fabricating such circuit boards. In particular, the present invention is concerned with employing metallic dendrites for connecting the subcomposites to each other. The present invention is especially advantageous in providing high density, high performance printed circuit boards.

BACKGROUND ART

Although there has been considerable activity in printed circuit board technology, high density printed circuitry is a relatively recent area of investigation. Only recently have materials and processes been developed which can be used to provide the demanding electrical mechanical properties required by high density configurations. High density packaging configurations are required in order to furnish fast access to large amounts of data in the next generation of computers, such as in supercomputers. Conventional packaging techniques will not meet the requirements of high speed signal processing systems. These sophisticated systems, with millions of circuit devices operate at cycle times in the range of one nanosecond or faster. At such speeds, present day packaging techniques will not suffice. Gains in processing speeds achieved at the integrated circuit level are lost when signals transfer between packaging levels and are required to travel long distances. Conventional packages will not permit signal propagation between chip and package without severe loss, distortion, cross-talk, and/or delay.

New packaging approaches, with the ways to package integrated circuits more efficiently, are required to meet this need.

A further challenge posed by the tremendous increase in circuit density on the chip is the power requirements of the package. Better packaging is achieved by increasing the package density, by reducing the thickness of the package including the power and reference planes. However, to meet power requirements, a greater amount of conductor is required. This dichotomy is resolved by creating a separate power board that is then attached to the signal board/chip carrier. When the chip carrier is a ceramic or glass/ceramic MCM, the attachment can be facilitated by a combination of braised pins on the MCM and harcorn springs in the board. However, surface mounted pins that can withstand the stresses of insertion are not possible when both the chip carrier and board substrate are made from an organic polymeric material. Accordingly, an objective of the present invention is to provide an attachment process for connecting two or more organic polymeric substrates.

In circuit boards which do not have the stringent dimensional requirements of high density circuit boards, alignment of through holes from layer to layer is made indirectly, by aligning mechanical location slots which are peripheral to the function of the device and are placed over locating pins in order to align multiple layers. However, in high density circuit boards, the denser circuitry, finer conductor line and track width, thinner dielectric layers, greater number of layers and denser placement of smaller diameter holes and vias require an absolute, dead-on alignment from layer to layer that is not attainable through means that were satisfactory in the past. In the high density circuitry of the future, through-hole tolerance is such that a small misalignment can mean that there is no electrical interconnection at all, or a high resistance interconnection, between the layers where low resistance is required. The alignment of wire cores to each other is thus seen to be a very demanding registration operation requiring optical registration at the key registration step, viz. drilling, exposing circuitry, laminating layers together. This alignment is currently verified by means of attachment coupled with x-ray examination.

The present invention reduces the need for x-ray verification of alignment since alignment can be verified electrically on a subcomposite level.

It is an object of the invention to produce a high density circuit board device exhibiting interlayer alignment and electrical communication.

SUMMARY OF INVENTION

The present invention is concerned with a method for interconnecting at least two organic polymeric substrates to each other and especially concerned with at least two organic polymeric subcomposites of a circuit board together. The method of the present invention provides for a certain degree of hermeticity whereby the interconnection is protected from environmental contamination such as from dust, perspiration, oxidation and wear caused by vibration and normal contact service.

In particular, the present invention is concerned with a method for connecting two or more organic polymeric subcomposites of a circuit board. The method includes providing metallic dendrites on electrical contact pads of the two organic polymeric subcomposites. The electrical contact pads of one of the subcomposites face electrical contact pads of the other of the organic polymeric subcomposites. In addition, electrical contact pad on one of the subcomposites is larger than the corresponding electrical contact pad it faces on the other subcomposite. The electrical contact pads having the metallic dendrites thereon are contacted with opposing facing electrical contact pads of the other subcomposite having dendrites thereon. At this stage, if desired, the structure can be tested for continuity and/or alignment. The subcomposites are then heated while the electrical contact pads that face each other are in contact with each other to thereby thermally reflow the polymeric organic material of the subcomposites and form a bonded composite. The bonded composite is then permitted to cool to thereby provide the bonding of the subcomposites.

The present invention is also concerned with a bonded composite obtained by the above-disclosed method. A further aspect of the present invention is concerned with an integrated circuit board that comprises at least two organic polymeric subcomposites wherein the subcomposites are bonded to each other by metallic dendrites on electrical contact pads of the subcomposites. The electrical contact pads of one of the organic polymeric subcomposites face electrical contact pads of the other of the organic subcomposites. Moreover, an electrical contact pad on one of the subcomposites is larger than the corresponding electrical contact pad it faces on the other subcomposite.

BEST AND VARIOUS MODES FOR CARRYING OUT INVENTION

Figure 1:
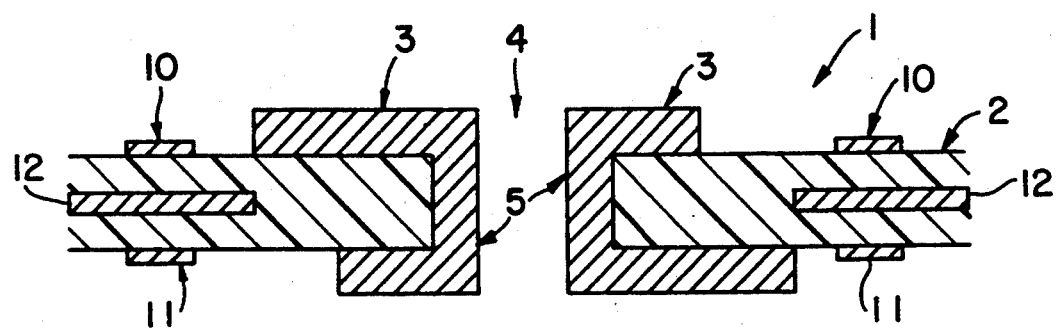
FIGS. 1–5 are schematic diagrams illustrating the method of the present invention.

In order to facilitate an understanding of the present invention, reference is made to the Figures. In particular, FIG. 1 illustrates a subcomposite assembly to be connected pursuant to the present invention. The subcomposite 1 comprises a dielectric substrate 2 and metallic electrical contact pads 3 and vias 4. The term vias is normally used to describe conductive pathways within the circuit board which connect adjacent conductive layers. The term through-hole is normally used to describe vias that extend to non-adjacent conductive layers. The term through-hole is normally used to describe vias which extend to non-adjacent conductive layers. The term blind via is sometimes used to refer to a through-hole which terminates internally. For the sake of brevity, the term through-hole may hereafter be used to refer to both. Vias 4 includes electrical conductive layer 5 which in the example shown is the same as that which that forms the electrical contact pads 3. According to preferred aspects of the present invention such is copper and is typically about 0.2 to about 1 and more typically about 0.25 to about 0.5 mils thick. The vias 4 provide for electrical communication between conducting layers.

Dielectric substrates including thermoplastic thermosetting resins, may be employed in accordance with the present invention.

Typical thermosetting polymeric materials include epoxy, phenolic based materials, and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers.

According to preferred aspects of the present invention, the dielectric substrate 2 is a material having a dielectric constant (ER) of about 3.2 or less in order to reduce signal propagation delays and reduce signal noise and attenuation. A dielectric constant of 3.2 or less also permits reduction in signal-to-power spacings. Suitable materials which can be used to provide a dielectric constant of 3.2 or less include fluorocarbon polymers such as for example polytetrafluoroethlyene (PTFE), polychlorotrifluoroethylene (CTFE), and polyperfluoropropylene, optionally filled with a filler such as quartz or silicon particles and optionally reinforced with a fabric such as woven fluorocarbon fabric.

The present invention is especially advantageous in providing high density, high performance printed circuit boards.

In the present invention, the term high density typically refers to dimensions of the following approximate values in a printed circuit card or board:

| Line Width | 50 | Microns | (Approx. 2. mils) |
|---|---|---|---|
| Line Thickness | 12.5 | Microns | (Approx. 0.5 mils) |
| Via Diameter | 63 | Microns | |
| | ±25 | Microns | (2.5 ± 1.0 mil) |
| Land Diameter | 120 | Microns | (4.7 mils) |
| Clearance Hole | 170 | Microns | (6.7 mils) |
| Core Thickness | 127 | Microns | (5.0 mils) |

Packaging chips in a surface mount mode, called also direct chip attach (DCA), can require wiring densities exceeding several thousand inches per square inch and via densities which can exceed 10,000 vias per square inch for very high I/O chips in close proximity.

A high density circuit board having the above-mentioned dimensions would be capable of providing wiring capability of approximately 100 inches per square inch per wiring plane and via densities of about 5,000 to about 10,000 vias per square inch. The total wiring requirement would be satisfied by adding a sufficient number of wiring planes to accommodate the number of chips. The small diameter via typically required precludes building such a high density board through traditional multi-layer lamination and drill processes. In order to produce wiring and via densities of this magnitude, stacked via method are used. A stacked via board is a circuit board which is made up of individual 2S1P (two signal planes plus one power plane) units joined at the vias to provide communication between 2S1P units.

The present invention is especially suitable for providing 2S1P units and for joining such units to each other.

The subcomposite illustrated in FIG. 1 is for a so-called 2S1P core since it contains two signal planes 10 and 11 and one power plane 12. The power plane 12 may be comprised, for example, of Invar or copper, or copper clad Invar, or copper clad molybdenum.

Figure 2:
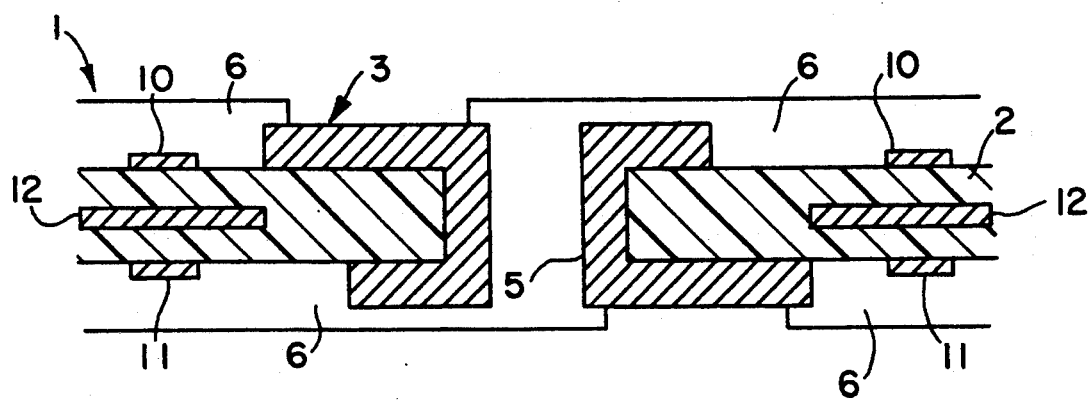

Next a dielectric material 6 is applied above the metallic layers 3 and in through-hole 4 (see FIG. 2). The dielectric material may or may not be photosensitive and may be either thermoplastic or thermosetting. In either case, the material is processed to thereby expose and provide at least one electrically conductive contact pad or so-called via-land site at which a joining metal connection is desired. In the case of a photosensitive dielectric, the material would be photo processed to form the cavities by means such as ultraviolet, electron beam or x-ray lithography, depending on the nature of the photosensitive dielectric material. In the case of a non-photosensitive dielectric, the cavities would be formed through, for example, laser ablation at the sites where a connection is desired.

Suitable dielectric materials include fluorocarbon polymeric materials and cyanate resins. Suitable photosensitive materials include OPR (Optimized Permanent Resist described in U.S. Pat. No. 4,940,651 issued Jul. 10, 1990 to Brown et al, which is incorporated herein by reference) HTM (High Temperature Mask) described in copending Ser. No. 07/382,311 to Gelorme et al, filed in the United States Patent and Trademark Office on Jul. 20, 1989, incorporated herein by reference, and commonly assigned to the present assignee. FIG. 2 illustrates the presence of electrically conductive pads on both surfaces of substrate 1. However, it is understood that only one side of the substrate 2 necessarily includes a contact pad. These contact pads are also referred to as lands. The dielectric layer 6 at this stage of the process should not be subjected to final cure conditions. The dielectric layer 6 is typically about 1 to about 6 mils thick and preferably about 2 to about 3 mils thick.

In order to provide enhanced adhesion of subsequently applied layers, it is desirable but not necessary to roughen the surface of the dielectric and exposed electrical contact pads such as by vapor blasting.

Next, metallic dendrites are provided on the electric contact pads. The preferred dendrites are from palladium metal which posses the desirable mechanical and physical properties. The dendrites cover the exposed metallic area of the contact pads. One method for providing the dendrites is to apply a photo resist material 7 to the structure and then expose and develop the resist according to known photolithographic techniques to provide the exposed area for the subsequently to be formed dendrites. (See FIG. 3).

Typical photoresist materials are methacrylate polymeric resist compositions and electrophoretic resists such as those obtainable from Shipley.

According to a preferred method, an intermediate layer of nickel is electroplated onto the thin copper plating followed by an intermediate layer of palladium, after applying resist material 7.

The nickel layer is typically about 1 to about 2.5 microns and more typically about 2 microns thick. The nickel covers the copper to prevent it from contaminating the palladium plating composition.

In addition this intermediate layer of palladium is typically about 1 to about 2.5 microns and more typically about 2 microns thick. Typical compositions and parameters for electroplating these layers of nickel and palladium are disclosed in U.S. patent application Ser. No. 07/606,007, and now U.S. Pat. No. 5,137,461, filed Oct. 30, 1990 entitled "Separable Electrical Connection Technology," disclosure of which is incorporated herein by reference.

Figure 3:
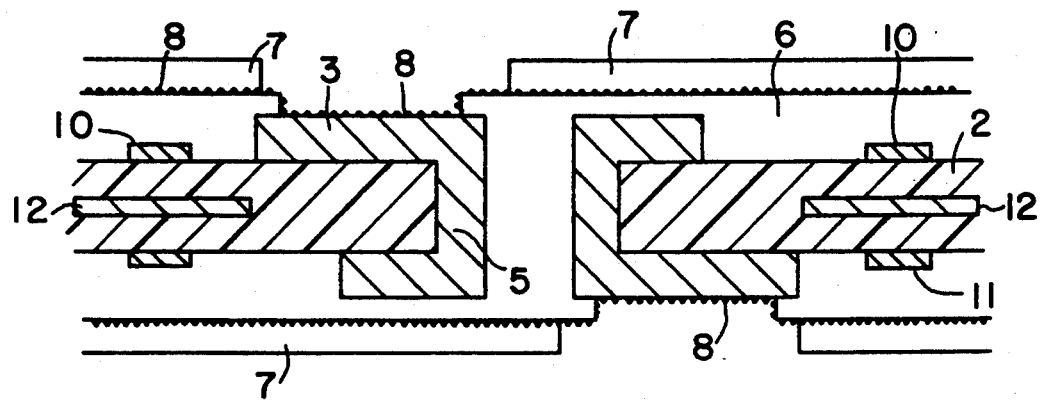

The combined nickel and palladium layers are referred to as numeral 8 in FIG. 3.

The dendrites 9 (see FIG. 4) are then formed on the intermediate palladium layer by any known technique such as by ultrasonic plating of palladium typically at about 80 to 100 milleamps/cm$^2$ of surface area of contact pad. Typical palladium compositions are disclosed in U.S. patent application Ser. No. 07/606,007 entitled "Separable Electrical Connection Technology," disclosure of which is incorporated herein by reference. It is preferred that the dendrites are about 0.5 to about 1 mil in height. If desired, each of the dendrites can be coated with a metal that could interface with or diffuse to form a metallic bond. For instance one of the dendrites can be coated with pure gold and the corresponding dendrite with tin.

The photoresist 7 is then removed by stripping in a suitable solvent, such as propylene carbonate.

Figure 4:
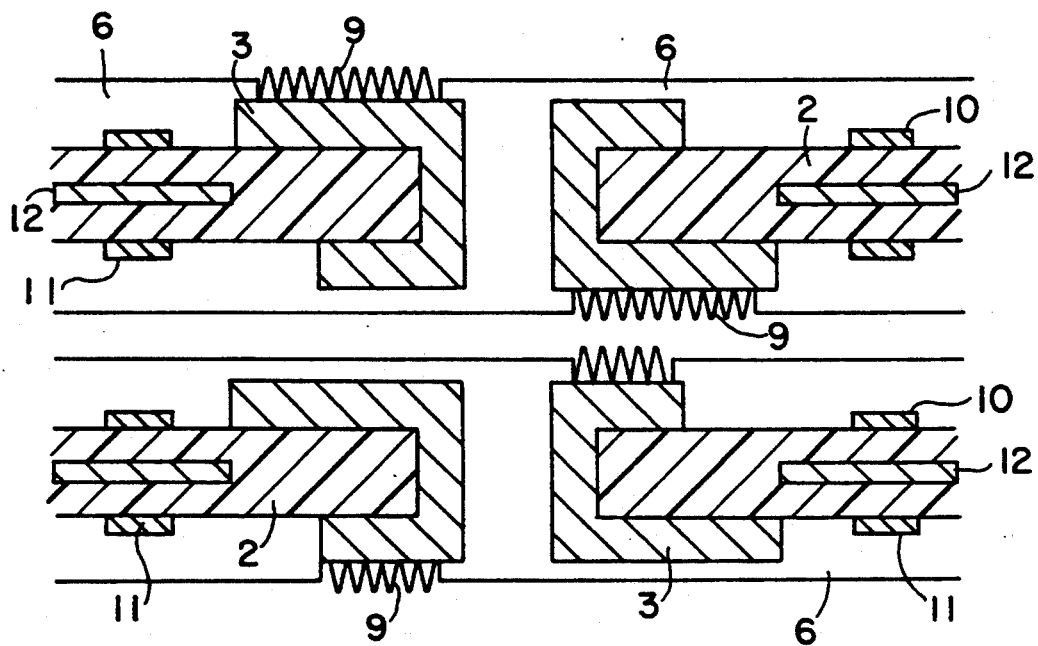
Figure 5:
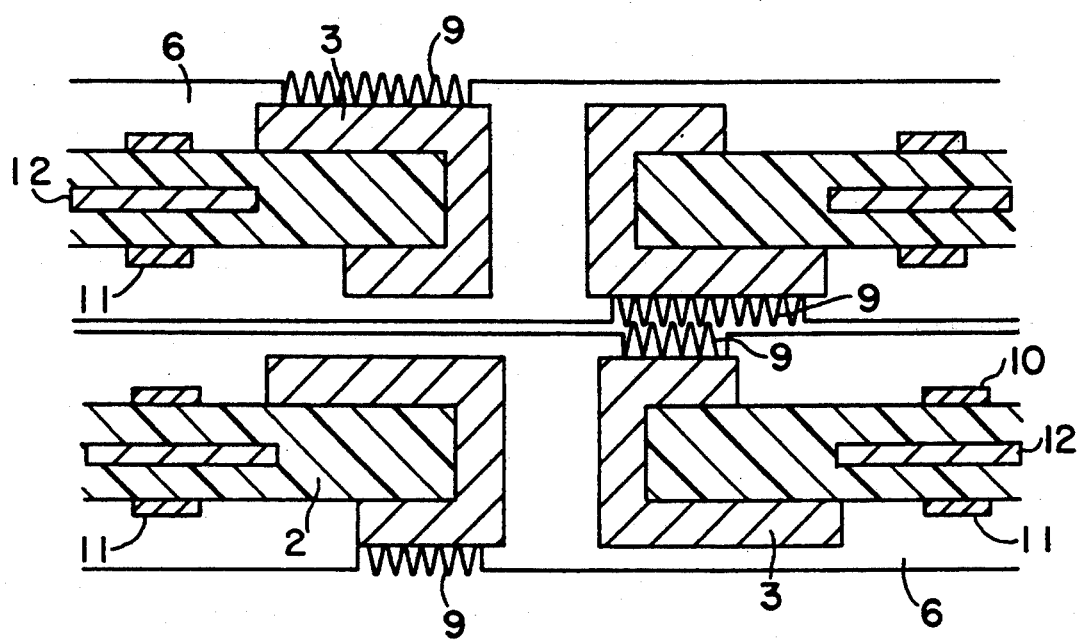

Next, the subcomposite is contacted with another subcomposite whereby electrical contacts that face each other are contacted (see FIG. 4). It is essential to the success of the present invention, that electrical contact pads on one of the organic polymeric subcomposites is larger than electrical contact pads on the other organic subcomposite. This provides for proper alignment of the subcomposites with each other by providing sufficient tolerance. Typically the larger electrical contact pads and therefore larger area covered by dendrites are about 25 percent to about 75 percent larger than the other contact pads and preferably about 30 to about 60 percent larger. The pads are typically about 5 mils to about 100 mils wide.

The subcomposites can be mated initially below the melting point of the organic polymeric material at relatively low temperatures of about 25° C. (normal room temperature) to about 200° C. and then tested to determine whether proper interconnection has been achieved. At this stage of the process, if it is necessary to rework or repair the subcomposites such can be readily separated by physically lifting one off of the other. One of the advantages of the present invention is that the subcomposite interconnection can be tested to determine whether the interconnection has been successfully achieved and if not the subcomposites can be reworked or repaired without discarding the subcomposites.

Once the interconnections have passed the quality testing, the composite can then be subjected to a final cure and laminating procedure whereby the subcomposites are heated to temperatures typically of at least about 250° C. and more typically of about 250° C. to about 400° C. under pressure of about 100 psi to about 500 psi while the electrical contact pads that face each other are maintained in contact with each other. This heating results in a bonded composite which is then permitted to cool to provide permanent bond of the composites to each other.

The following non-limiting example is presented to further illustrate the present invention:

EXAMPLE

Two polytetrafluoroethylene subcomposites each having copper contact pads provided with intermediate layers of nickel and palladium followed by palladium dendrites thereon of an average height of 1 mil are provided with the surface area of contact pads of one of the subcomposites being at least 25 percent greater than that of the other composite. The palladium dendrites on one of the subcomposites is electroplated with pure gold at a thickness of about 3 to 4 microns. The palladium dendrites on the other substrate are electroplated with tin at a thickness of about 1 to 2 microns.

The gold plated palladium dendrites are then contacted at room temperature with corresponding tin plated palladium dendrites and the assembly is tested for proper alignment.

Next the assembly is laminated by heating to about 310° C. under pressure of about 500 psi which causes the gold and tin to bond together. The temperature is then raised to about 350° C. to about 380° C. at a pressure of about 500 psi resulting in a bond between the polytetrafluoroethylene of the contacting subcomposites. The entire heating procedure takes about 1 hour.

What is claimed is:

1. A method for connecting at least two organic polymeric subcomposites of a circuit board which comprises:
   (a) providing metallic dendrites on electrical contact pads of said two organic polymeric subcomposites wherein electrical contact pads of one of said organic polymeric subcomposites face electrical contact pads of the other of said organic subcomposites; and wherein an electrical contact pad on one of the subcomposites is larger than the electrical contact pad it faces on the other subcomposite;
(b) contacting the electrical contact pads that face each other;
(c) heating said subcomposites while the said electrical contact pads that face each other are in contact with each other to form a bonded composite;
(d) and then permitting said bonded composite to cool.

2. The method of claim 1 wherein said dendrites are palladium.

3. The method of claim 1 wherein the larger of the electrical contact pads is about 25 percent to 75 percent larger widthwise as compared to the other of the electrical contact pads.

4. The method of claim 1 wherein said subcomposites are heated to at least about 250° C.

5. The method of claim 4 wherein said subcomposites prior to the said heating are at a temperature of about 25° C. to about 200° C. and below the melting point of said organic polymeric material to provide a temporary bond.

6. The method of claim 1 wherein the height of said dendrites is about 0.5 mil to about 1 mil.

7. The method of claim 1 wherein said dendrites are provided by ultrasonic electroplating.

8. The method of claim 7 wherein said dendrites are provided by providing a layer of nickel and a layer of palladium on said electrical contact pads prior to said ultrasonic electroplating.

9. The method of claim 1 wherein said electrical contact pads are copper.

* * * * *